United States Patent
Koide

(10) Patent No.: US 7,292,465 B2
(45) Date of Patent: Nov. 6, 2007

(54) FERROELECTRIC RANDOM ACCESS MEMORY DEVICE, DISPLAY DRIVE INTEGRATED CIRCUIT, AND ELECTRONIC APPARATUS

(75) Inventor: Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/448,530

(22) Filed: Jun. 7, 2006

(65) Prior Publication Data

US 2007/0002605 A1    Jan. 4, 2007

(30) Foreign Application Priority Data

Jul. 1, 2005    (JP)    ............................. 2005-194382
Feb. 22, 2006    (JP)    ............................. 2006-045547

(51) Int. Cl.
*G11C 11/22*    (2006.01)

(52) U.S. Cl. .................... 365/145; 365/63; 257/295

(58) Field of Classification Search ............ 365/52
See application file for complete search history.

(56) References Cited

U.S. PATENT DOCUMENTS 4,032,903 A *    6/1977 Weimer ..................... 365/183
5,422,840 A *    6/1995 Naiki .......................... 365/156
6,784,468 B2    8/2004 Honda
7,183,595 B2 *    2/2007 Honda ........................ 257/209
2006/0039177 A1 *    2/2006 Fukada ...................... 365/145

FOREIGN PATENT DOCUMENTS

JP    2002-170935    6/2002

* cited by examiner

*Primary Examiner*—Tan T. Nguyen
(74) *Attorney, Agent, or Firm*—Harness, Dickey & Pierce, P.L.C.

(57) ABSTRACT

A ferroelectric random access memory device, includes at least one bit line extending in a first direction; a plurality of first active regions, arranged in the first direction a predetermined distance from each other on one side of the bit line, each being connected to the bit line and a first ferroelectric capacitor; and a plurality of second active regions, arranged in the first direction a predetermined distance from each other on the other side of the bit line, each being connected to the bit line and a second ferroelectric capacitor, the first active regions partly overlapping, in the first direction, the second active regions respectively neighboring the first active regions, and being arranged a predetermined distance from the respective neighboring second active regions in a second direction crossing the first direction.

13 Claims, 13 Drawing Sheets

FERROELECTRIC RANDOM ACCESS MEMORY DEVICE, DISPLAY DRIVE INTEGRATED CIRCUIT, AND ELECTRONIC APPARATUS

CROSS-REFERENCES TO RELATED APPLICATIONS

The entire disclosure of Japanese Patent Application No. 2005-194382, filed on Jul. 1, 2005, and Japanese Patent Application No. 2006-045547, filed Feb. 22, 2006, are expressly incorporated herein by reference.

BACKGROUND

1. Technical Field

The present invention relates to a ferroelectric random access memory device, a display drive integrated circuit, and an electronic apparatus.

2. Related Art

Ferroelectric random access memory (FeRAM) devices, which store information by utilizing the hysteresis found between the polarization and electric field of ferroelectric material, have been drawing attention because of their high-speed operation, low power consumption and non-volatility.

These ferroelectric random access memory devices, as with other memory devices, have the constant problem of memory cell integration density improvement, or size reduction.

For example, JP-A-2002-170935 describes a ferroelectric random access memory device in which active regions connected to a predetermined bit line are arranged in a line along the bit line, and it discloses a technique to reduce the ferroelectric memory cell area through ingenuity in the shape or arrangement of plate lines, word lines and active regions.

However, conventional ferroelectric random access memory devices like the above have a problem in that they have long bit lines, i.e., are long in the direction the bit lines extend, and as a result, the size of the ferroelectric random access memory will be large in that direction.

Meanwhile, various electronic apparatuses have been employing the aforementioned ferroelectric random access memory because of its high-speed operation, low power consumption, and non-volatility. Thus, for example, in a display drive integrated circuit (IC) used in a display apparatus, as detailed later, a larger wiring spacing than that set forth in ordinary design rules (e.g., minimum wiring spacing) may be set in relation to the connection with the display, etc.

Therefore, in addition to the integration density improvement or size reduction of ferroelectric random access memory devices, it is also necessary to improve the integration density of memory cells while conforming to a permitted wiring spacing.

SUMMARY

Accordingly, an advantage of some aspects of the invention is provision of a ferroelectric random access memory device, a display drive integrated circuit and an electronic apparatus that can solve the aforementioned problems.

In other words, the advantage is integration density improvement or size reduction of a ferroelectric random access memory device, and specifically, provision of a ferroelectric random access memory device with a high integration density in the direction the bit lines extend. Another advantage of some aspects of the invention is integration density improvement or size reduction (layout optimization) of a ferroelectric random access memory device used in a display drive IC, and specifically, improvement of the integration density, in the direction the bit-lines extend, of a ferroelectric random access memory device used in a display drive IC.

The above advantages can be achieved with the combination of the features recited in the claims.

(1) In order to achieve the above advantages, a first embodiment of the invention provides a ferroelectric random access memory device, including: at least one bit line extending in a first direction; a plurality of first active regions, arranged in the first direction a predetermined distance from each other on one side of the bit line, each being connected to the bit line and a first ferroelectric capacitor; and a plurality of second active regions, arranged in the first direction a predetermined distance from each other on the other side of the bit line, each being connected to the bit line and a second ferroelectric capacitor, the first active regions partly overlapping, in the first direction, the second active regions respectively neighboring the first active regions, and being arranged a predetermined distance from the respective neighboring second active regions in a second direction crossing the first direction.

According to the above embodiment, the first active regions and the second active regions connected to the ferroelectric capacitors connected to the bit line will be arranged on both sides of the bit line, and the first active regions and the second active regions will overlap each other in the first direction, i.e., in the direction the bit line extends. Therefore, the above embodiment makes it possible to provide a ferroelectric random access memory device with its length in the direction the bit-line extends shortened.

Also, according to the above embodiment, the bit line length can be reduced, and thus, the capacitance of the bit line can also be reduced. Consequently, a larger operation margin can be secured for a sense amplifier, the power consumption of the ferroelectric random access memory device can also be reduced, and furthermore, noise superposition in the bit line can be reduced.

(2) In the above ferroelectric random access memory device, it is preferable that the plurality of first active regions and the plurality of second active regions each have a first end and a second end; that the first ends of the first active regions overlap the second ends of the respective neighboring second active regions in the first direction; and that the first ends of the second active regions overlap the second ends of the respective neighboring first active regions in the first direction.

According to the above embodiment, both ends of the first and second active regions overlap each other in the direction the bit line extends, making it possible to provide a ferroelectric random access memory device with its length in the direction the bit line extends further shortened.

(3) In the above ferroelectric random access memory device, it is preferable that the first ferroelectric capacitors are connected to the first ends of the respective first active regions; that the second ferroelectric capacitors are connected to the second ends of the respective second active regions; and that the ferroelectric random access memory device further includes a first plate line extending in the second direction and connected to a first ferroelectric capacitor from among the first ferroelectric capacitors and a second ferroelectric capacitor from among the second ferroelectric capacitors.

According to the above embodiment, ends of the first and second active regions overlap each other in the first direction, and the first and second ferroelectric capacitors are connected to their respective ends. So the above embodiment makes it possible for the first plate line connected to the first and second ferroelectric capacitors to be formed in a substantially-straight line or in a shape having few curve or corner portions, making it possible to reduce the loads on the first plate lines.

(4) In the above ferroelectric random access memory device, it is preferable that the first ferroelectric capacitors are connected to the first ends of the respective first active regions; that the second ferroelectric capacitors are connected to the second ends of the respective second active regions; and that the ferroelectric random access memory device further includes: a first plate line extending in the second direction and connected to a first ferroelectric capacitor from among the first ferroelectric capacitors and a second ferroelectric capacitor from among the second ferroelectric capacitors; a third ferroelectric capacitor connected to each of the second ends of the first active regions; a fourth ferroelectric capacitor connected to each of the first ends of the second active regions; and a second plate line extending in the second direction and connected to a third ferroelectric capacitor from among the third ferroelectric capacitors and a fourth ferroelectric capacitor from among the fourth ferroelectric capacitors.

According to the above embodiment, the ends of the first and second active regions overlap each other in the first direction, and the first to fourth ferroelectric capacitors are connected to their respective ends. Thus, the above embodiment makes it possible for the first and second plate lines connected to the first to fourth ferroelectric capacitors to be each formed in a substantially-straight line or in a shape having few curve or corner portions, making it possible to reduce the loads on the first and second plate lines.

(5) In the embodiment, it is preferable that the first ferroelectric capacitors are connected to the first ends of the respective first active regions; that the second ferroelectric capacitors are connected to the second ends of the respective second active regions; and that the ferroelectric random access memory device further includes: a first plate line extending in the first direction and connected to the first ferroelectric capacitors; and a second plate line extending the first direction and connected to the second ferroelectric capacitors.

According to the above embodiment, in a ferroelectric random access memory device having first and second active regions arranged with their ends overlapping each other in a first direction, and having its length in the first direction shortened, first and second plate lines are arranged in the first direction, and thus, they will be shortened, making it possible to reduce the loads on the plate lines.

(6) The ferroelectric random access memory device preferably includes a first word line extending in the second direction on a region of a first active region, from among the first active regions, that overlaps its neighboring second active region, from among the second active regions, and it is preferable that the first word line is arranged so that it extends, between a second active region from among the second active regions and another second active region neighboring the second active region, in the first direction, avoiding the second active region.

According to the above embodiment, even if the first and second active regions are arranged so that they overlap in the first direction, the first and second ferroelectric capacitors can be driven by different word lines, facilitating easy memory cell selection.

(7) In the ferroelectric random access memory device, it is preferable that that the bit line is connected to first areas between the first ends and the second ends of the first active regions, and also to second areas between the first ends and the second ends of the second active regions; and that the ferroelectric random access memory device further includes: a first word line extending in the second direction and running between the first end and the first area of a first active region from among the first active regions; a second word line extending in the second direction and running between the second end and the first area of a first active region from among the first active regions.

According to this embodiment, the first and second ferroelectric capacitors connected to the first plate line will be driven by different word lines, and thus, even if the first and second active regions are arranged so that they overlap each other in the first direction, a memory cell can easily be selected. According to the above embodiment, the number of plate lines can be reduced, and furthermore, the area of a plate line control unit that controls the voltages of the plate lines can also be reduced.

(8) In the ferroelectric random access memory device, it is preferable that the first word line and the second word line extend between a predetermined second active region, from among the second active regions, neighboring the first end of the first active region on which they extend, and another second active region, from among the second active regions, neighboring the second end of the first active region; and that the distance between the first word line and the second word line in the first active region is larger than the distance between the first word line and the second word line where they are between the second active region and the other second active region.

According to the above embodiment, the space of a plurality of first active regions in a first direction and the space of a plurality of second active regions in a first direction can further be reduced, making it possible to provide a ferroelectric random access memory device with its length in the direction the bit line extends further shortened.

(9) In the above ferroelectric random access memory device, it is preferable that the first word line and the second word line extend between a predetermined second active region, from among the second active regions, neighboring the first end of the first active region on which they extend, and another second active region, from among the second active regions, neighboring the second end of the first active region; and that the distance between the first word line and the second word line in the first active region is substantially the same as the distance between the first word line and the second word line where they are between the second active region and the other second active region.

According to the above embodiment, first and second active regions are arranged so that they overlap each other in a first direction, and therefore, the length in the direction the bit line extends (the first direction) can further be shortened, and the curve or corner portions of the first and second word lines can be reduced to make the word lines substantially straight. Consequently, it is possible to provide a ferroelectric random access memory device with its length in the direction word lines extend (the second direction) shortened.

(10) In the above ferroelectric random access memory device, it is preferable that a plurality of second active regions, arranged in the first direction a predetermined distance from each other on the other side of the bit line, each being connected to the bit line and a second ferroelectric capacitor, and a plurality of third active regions, arranged in the first direction a predetermined distance from each other on one side of another bit line neighboring the bit line, each being connected to the other bit line and a third ferroelectric capacitor, are arranged between the bit line and the other bit line; and that the second active regions partly overlap, in the first direction, the third active regions respectively neighboring the second active regions, and are arranged a predetermined distance from the respective neighboring third active regions in a second direction crossing the first direction.

(11) In the above ferroelectric random access memory device, it is preferable that a plurality of second active regions, arranged in the first direction a predetermined distance from each other on the other side of the bit line, each being connected to the bit line and a second ferroelectric capacitor, and a plurality of third active regions, arranged in the first direction a predetermined distance from each other on one side of another bit line neighboring the bit line, each being connected to the other bit line and a third ferroelectric capacitor, are arranged between the bit line and the other bit line; and that the second active regions substantially fully overlap the third active regions respectively neighboring the second active regions in the first direction, and are arranged a predetermined distance from the respective neighboring third active regions in a second direction crossing the first direction.

(12) A second embodiment of the invention provides a display drive integrated circuit including the above ferroelectric random access memory device. Display drive integrated circuits refer to any kind of devices that drive display devices, such as liquid display devices, etc.

(13) A third embodiment of the invention provides an electronic apparatus including the above ferroelectric random access memory device. Electronic apparatuses refer to apparatuses in general, that have a ferroelectric random access memory device according to the invention, and that execute a certain function. Their configurations are not specifically limited, and examples include various kinds of apparatuses requiring memory devices, including general computer apparatuses, portable telephones, PHSs, PDAs, electronic organizers and IC cards having the ferroelectric random access memory device.

DESCRIPTION OF EXEMPLARY EMBODIMENTS

Figure 1:
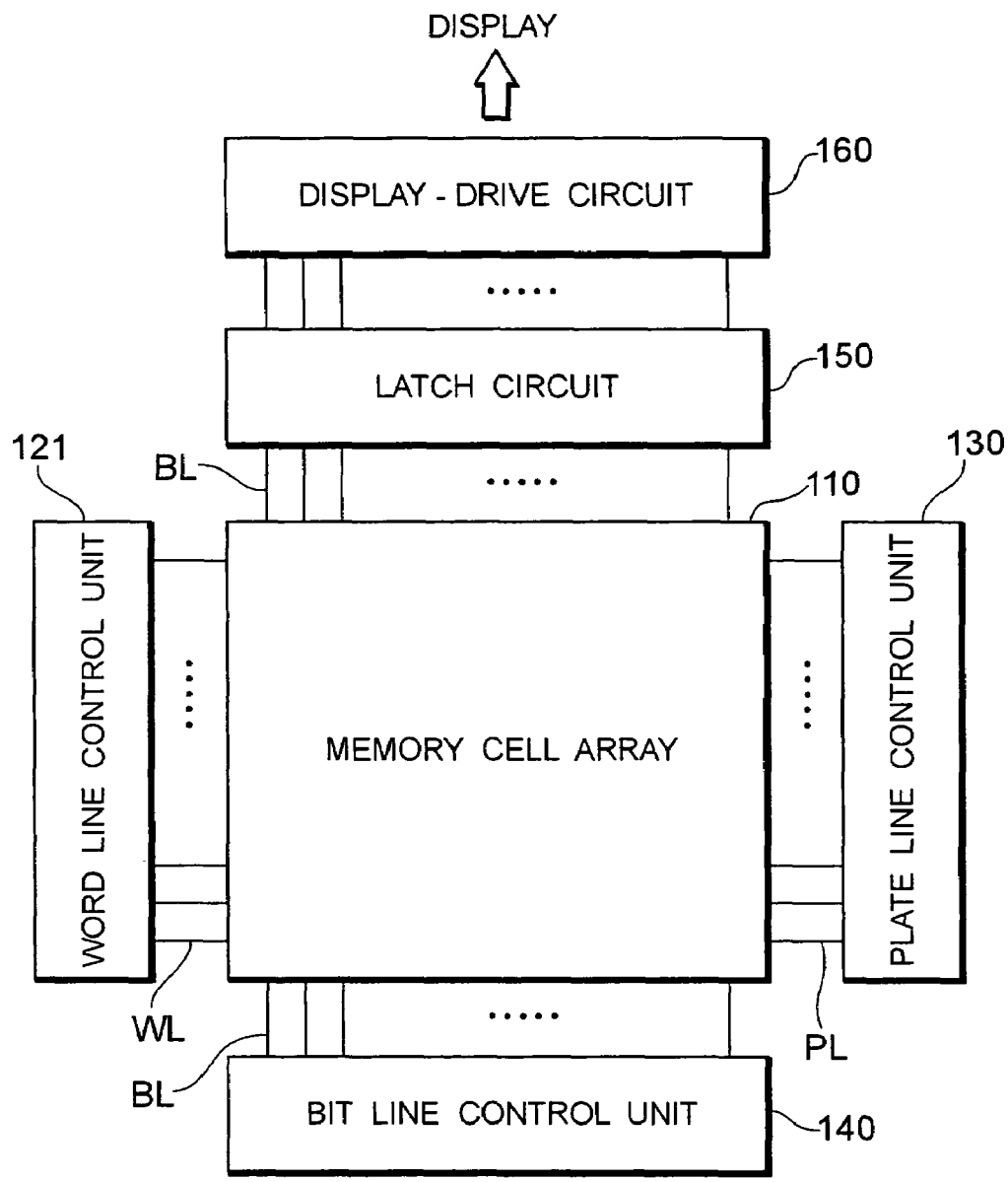
FIG. 1 is a block diagram illustrating the configuration of a display drive IC according to Embodiment 1.

Hereinafter, the invention will explained using embodiments with reference to the drawings. However, the below embodiments are not ones that limit the invention according to the claims, and all the combinations of the features described in the embodiments are not necessarily required for achieving the advantages of the invention. Incidentally, components in the drawings having the same function are provided with the same or related number, and the explanation of those components is not repeated.

Embodiment 1

FIG. 1 is a block diagram illustrating the configuration of a display drive IC according to an embodiment of the invention. The display drive IC includes a ferroelectric random access memory device, a latch circuit 150, and a display drive circuit 160. The ferroelectric random access memory device includes a memory cell array 110, a plurality of word lines WL, a plurality of plate lines PL, a plurality of bit lines BL, a word line control unit 121, a plate line control unit 130, and a bit line control unit 140.

The memory cell array 110, as described later, has a plurality of memory cells MC arranged in an array. Each memory cell MC is connected to one of the word lines WL, one of the plate lines PL, and one of the bit lines BL (see FIG. 2, for example). The word line control unit 121 and the plate line control unit 130 control the voltages of the word lines WL and the plate lines PL to read data stored in the memory cells out to the bit lines BL or store externally-supplied data in the memory cells MC via the bit lines BL. The latch circuit 150 latches data read from the memory cells, and the display drive circuit 160 drives an external display based on the latched data in the latch circuit 150.

Here, the external display may be a display device such as a liquid crystal display device. For example, each of the cells constituting the display of the liquid crystal display device has a switching transistor (TFT: thin film transistor), and pixel electrodes for sandwiching liquid crystal, and the cells are arranged in an array. Therefore, in order to drive these cells (pixels), a drive IC connected to the gate lines and source lines, etc., of the TFTs is required. The wiring spacing of the gate lines or source lines, etc., is often set to be larger than ordinary bit line spacing. For example, the spacing may be 1 to 1.3 times as large as the ordinary bit line spacing.

Here, a plurality of wirings for a display may be connected directly to a plurality of wirings for the memory cell array with smaller spacing than that for the display, but that connection will make the wiring complicated, possibly causing wire connection failures. When bit lines are arranged in accordance with the pitch of a plurality of wires in the display, the aforementioned wire connection failures may be reduced, but the size of the memory cell array will be larger by the increase in the bit line spacing. Therefore, a technique that improves the integration density, etc., of memory cells while conforming to a permitted wiring spacing has become crucial.

Figure 2:
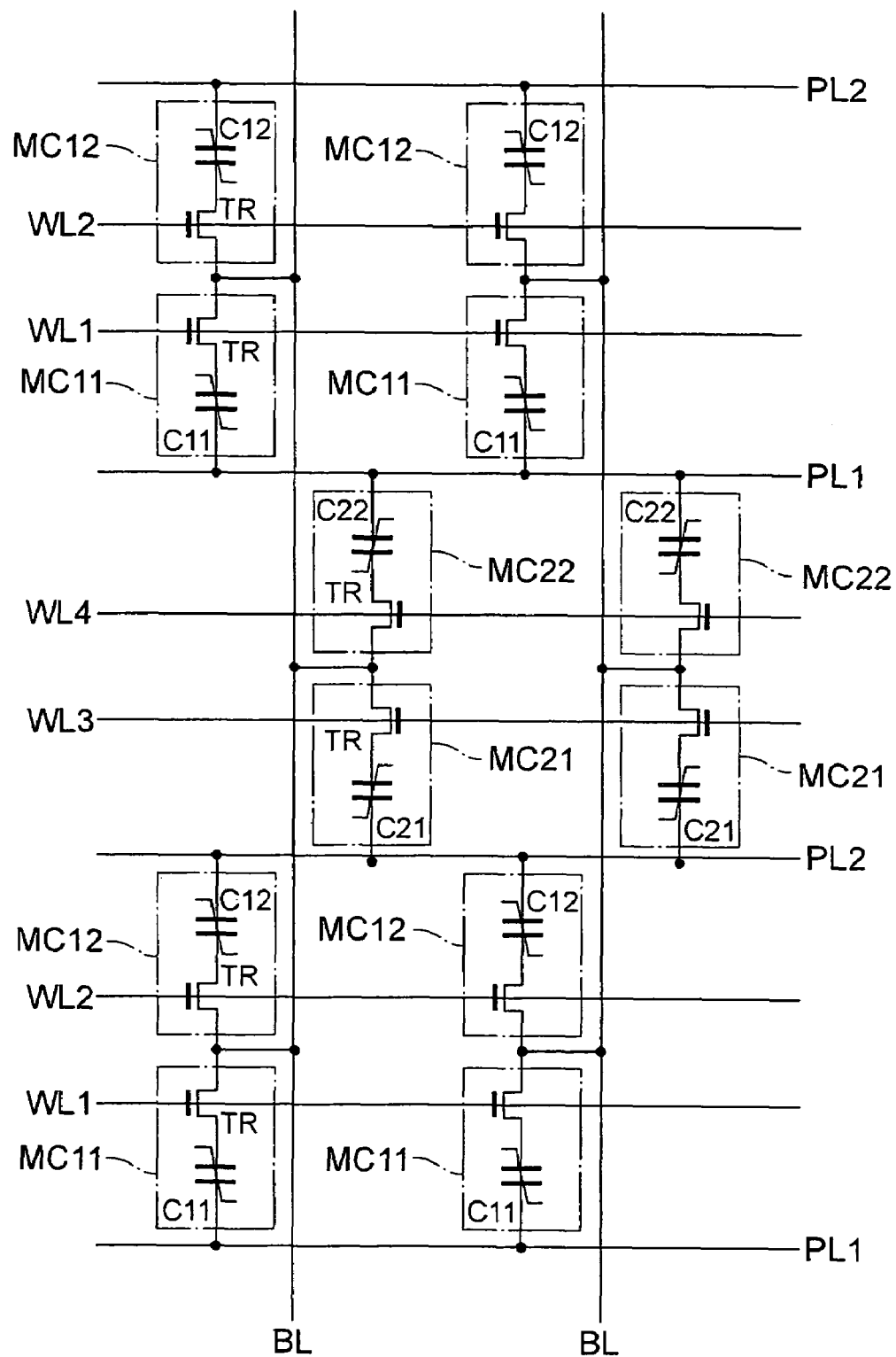
FIG. 2 is a circuit diagram illustrating the configuration of a memory cell array according to Embodiment 1.
Figure 4:
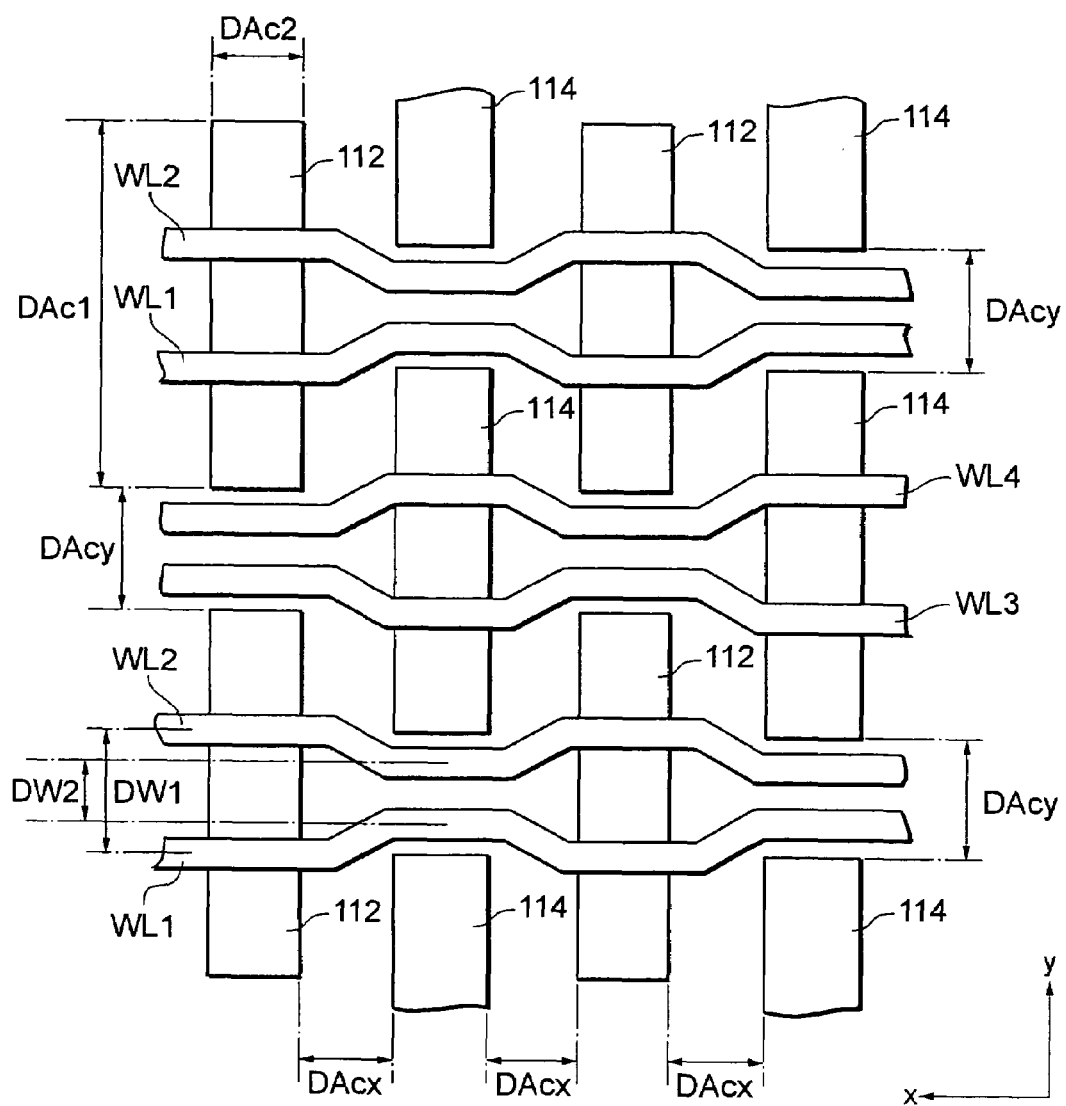
FIG. 4 is a plain view of a main part of the configuration of the memory cell array according to Embodiment 1.
Figure 5:
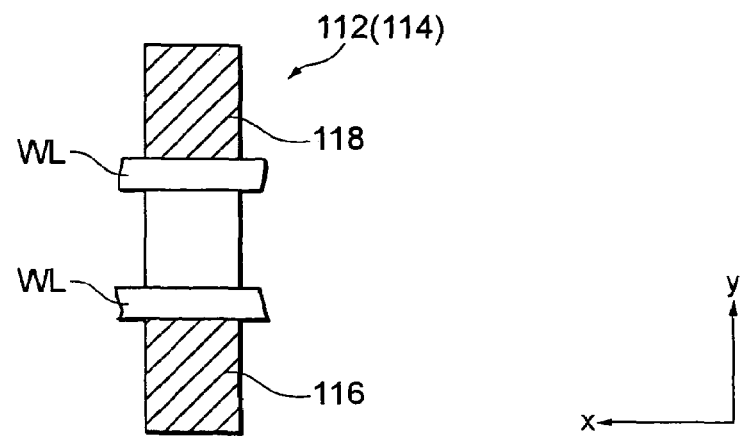
FIG. 5 is a plain view of a main part of the configuration of the memory cell array according to Embodiment 1.
Figure 6:
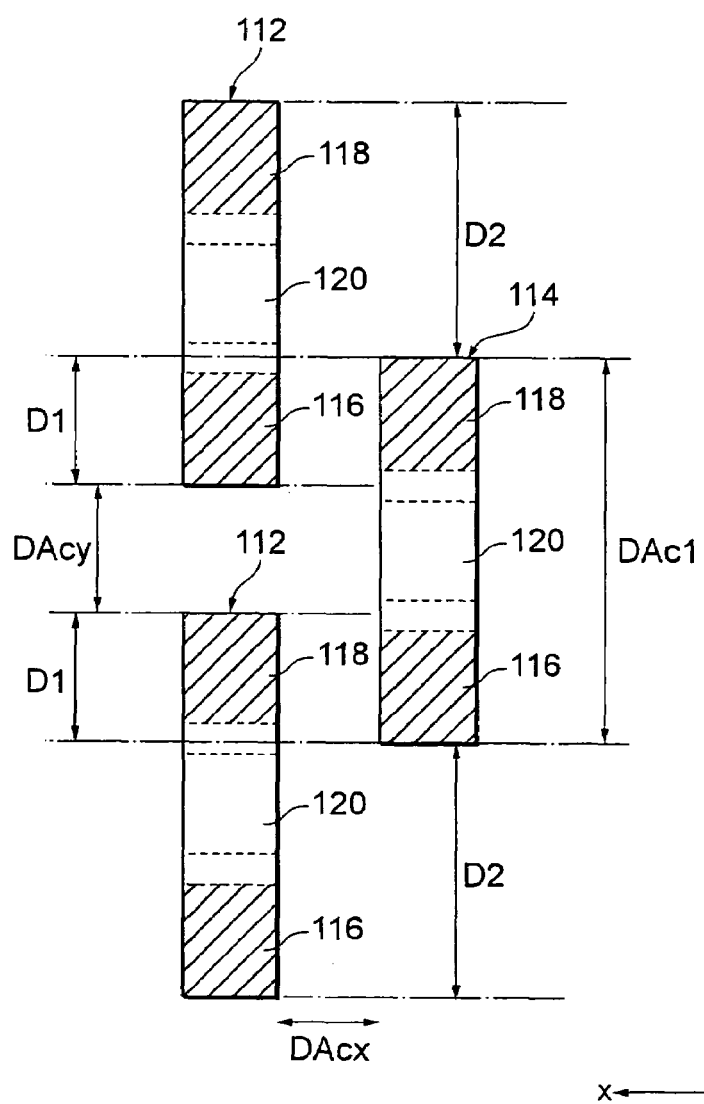
FIG. 6 is a plain view of a main part of the configuration of the memory cell array according to Embodiment 1.
Figure 7A:
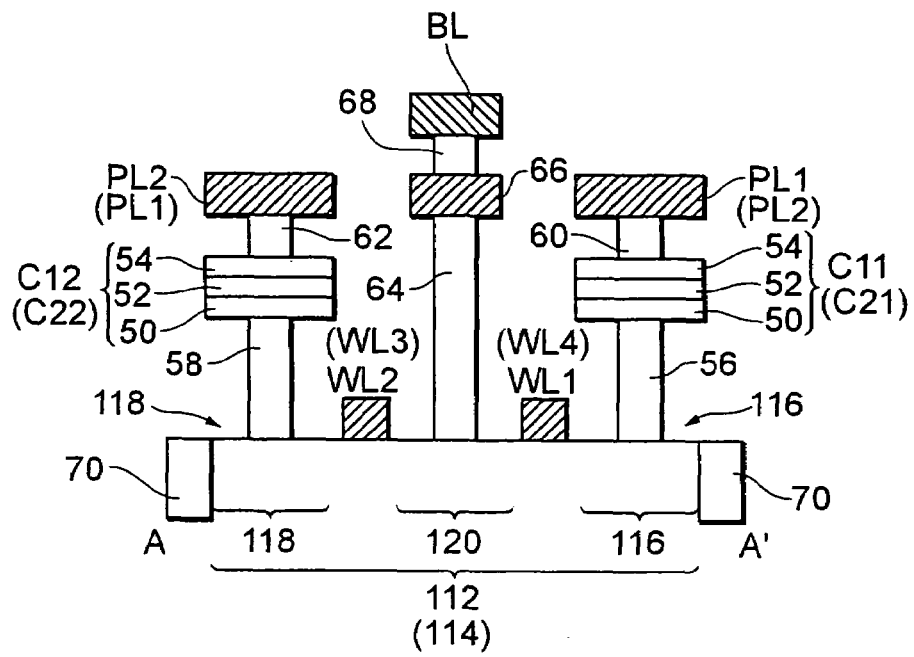
FIG. 7A and FIG. 7B are cross-sectional views of the memory cell array according to Embodiment 1.
Figure 7B:
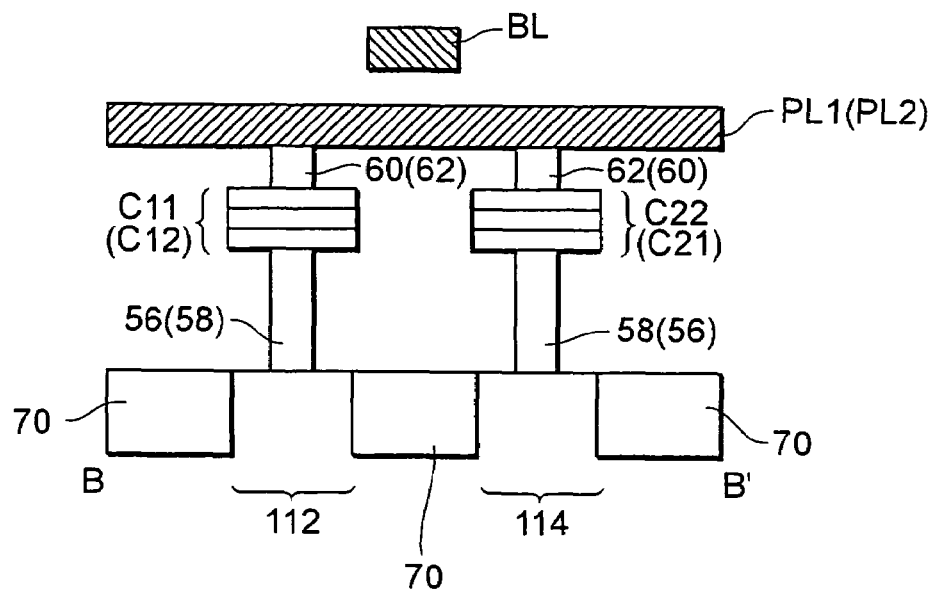

FIG. 2 is a circuit diagram illustrating the configuration of the memory cell array according to the embodiment. FIG. 3 to FIG. 6 are plain views of a main part of the configuration of the memory cell array according to the embodiment. FIG. 7A and FIG. 7B are cross-sectional views of the memory cell array according to the embodiment. FIG. 7A shows a cross-sectional view taken along I-I' of FIG. 3 and others, and FIG. 7B is a cross-sectional view taken along II-II' of FIG. 3 and others. FIG. 4 indicates the relationship between active regions 112 and 114 and word line WL1 to WL4 from among the planar pattern shown in FIG. 3. FIG. 5 indicates the relationship between one end 116 and the other end 118 of an active region (112 or 114). FIG. 6 indicates the overlap of the active regions 112 and 114 in the y direction. For ease of understanding, shadings have been provided also in the plain views.

The configuration of a memory cell array in a ferroelectric random access memory apparatus according to the embodiment will be described below with reference to FIG. 2 to FIG. 7.

As shown in FIG. 2 and other drawings in this application, the memory cell array 110 has a plurality of memory cells MC11, MC12, MC21, and MC 22 arranged in an array. The memory cells MC11, MC12, MC21, and MC22 have ferroelectric capacitors C11, C12, C21, and C22, respectively, and also each have an n-type MOS transistor TR.

In the circuit diagram shown in FIG. 2, the memory cells MC11 and MC12 are shown on the left sides of the bit lines BL, and the memory cells MC 22 and 21 shown on the right sides of the bit lines BL in order to indicate a first feature of this embodiment.

In this way, on one side of a bit line, a plurality of memory cells MC11 and MC12 are arranged, and on the other side of the bit line, a plurality of memory cells MC21 and MC22 are arranged, and these memory cells MC11, MC12, MC21, and MC22 are connected to the bit line.

The above configuration may also be expressed as two lines of memory cells, i.e., a line of memory cells consisting of memory cells MC21 and MC22, and a line of memory cells consisting of memory cells MC11 and MC12, being arranged between bit lines.

Here, a second feature of this embodiment, as can be seen from FIG. 2, is that the respective pluralities of memory cells MC11, MC12, MC21, and MC22 are connected to different word lines WL1 to WL4.

Also, a third feature of this embodiment is that an active region where memory cells MC11 and MC12 are formed, and an active region where memory cells MC21 and MC21 are formed partly overlap in the y direction.

The above features are detailed below with reference to FIG. 3 to FIG. 7.

Figure 3:
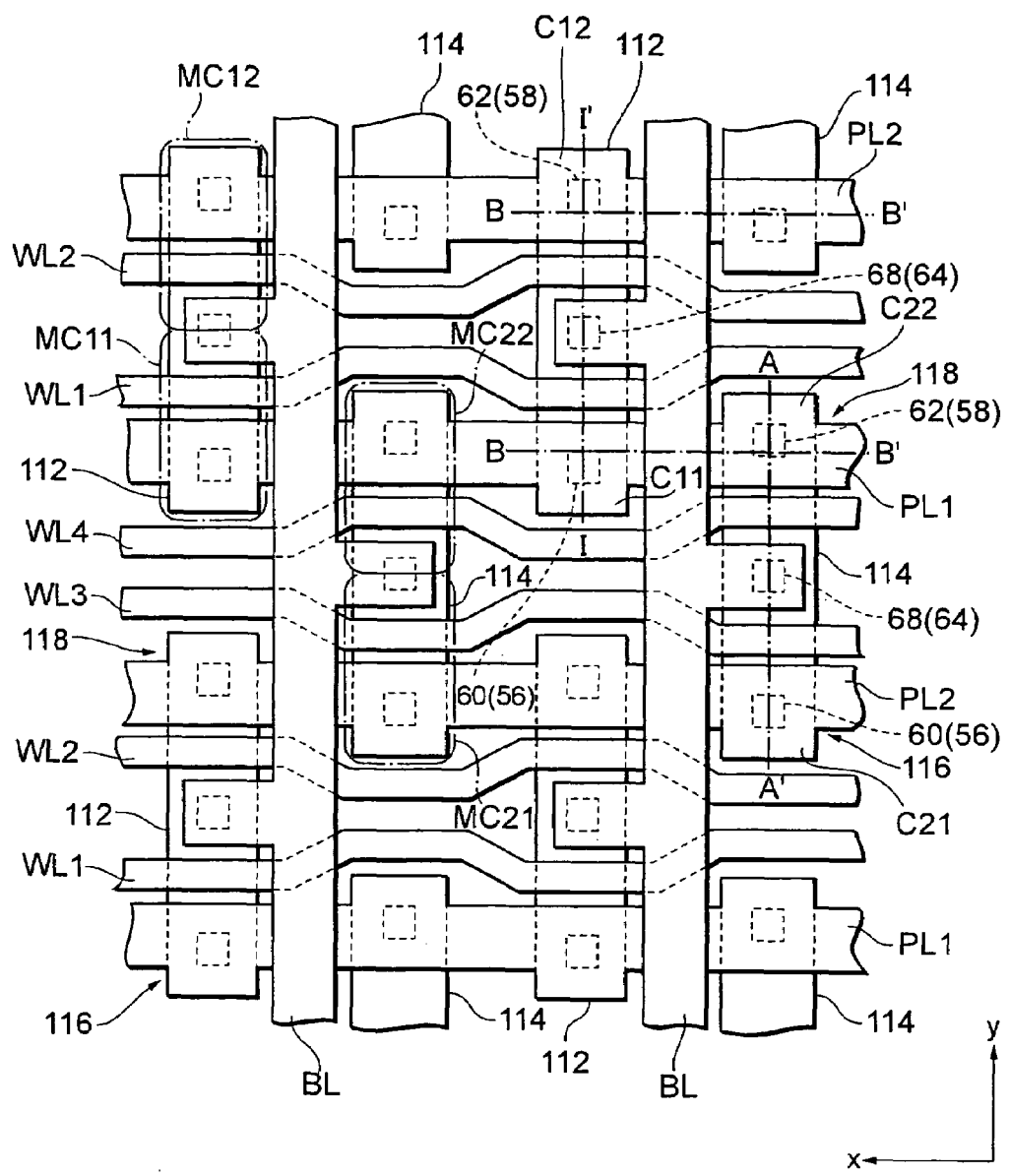
FIG. 3 is a plain view of a main part of the configuration of the memory cell array according to Embodiment 1.

As shown in FIG. 3 and other drawings in this application, on one side (the left side in FIG. 3) of each bit line BL, a plurality of memory cells MC11 and MC12 connected to each bit line BL is arranged. The memory cells MC11 and MC12 are connected to a plurality of first active regions 112 arranged on that side of each bit line. The plurality of first active regions 112 are arranged a predetermined distance (DAcy) from each other in the direction each bit line extend (the y direction) (see FIG. 4).

As shown in FIG. 3 and other drawings in this application, on the other side (the right side in FIG. 3) of each bit line BL, a plurality of memory cells MC21 and MC22 connected to each bit line BL is arranged. The memory cells MC21 and MC22 are connected to a plurality of second active regions 114 arranged on that other side of each bit line. Furthermore, as shown in FIG. 4 and other drawings in this application, the plurality of active regions 114 are arranged a predetermined distance (DAcy) from each other in the y direction.

Also, as shown in FIG. 4 and other drawings in this application, the first active regions 112 and the second active regions 114 each have a shape closely resembling a rectangle with the y direction as its longitudinal direction. The long side length is DAc1, and the short side length is DAc2. The distance in the x direction between a first active region 112 and a second active region 114 is DAcx.

Furthermore, as shown in FIG. 5 and other drawings in this application, the first active regions 112 and the second active regions 114 each have one end (e.g., the lower portion in FIG. 5) 116 and the other end 118 (e.g., the upper portion in FIG. 5) in the longitudinal direction (the y direction). The end 116 and the other end 118 are the respective source/drain regions of the n-type MOS transistor. The source/drain region refer to regions constituting the source or drain of a transistor.

Here, as shown in FIG. 3 and FIG. 6 (FIG. 3, FIG. 6 and other drawings in this application), the first active regions 112 and the second active regions 114 are arranged in a staggered pattern. Also, the first active regions 112 and the second active regions 114 partly overlap each other in the y direction. For example, as shown in FIG. 6, they are arranged so that they overlap each other for a distance D1.

More specifically, the first active regions 112 and the second active regions 114 are arranged so that the ends 116 of the first active regions 112 overlap the ends 118 of the second active regions 114 respectively neighboring the ends 116 in the y direction. As described above, the ends 116 of the first active regions 112 are arranged a predetermined distance (DAcx) from the ends 118 of the second active regions 114 in a direction crossing the y direction (the x direction). Incidentally, a distance D1 is represented by D1=(DAc1−DAcy)/2. The distance between the farthest end portions of the active regions 112 and 114 is D2.

The first active regions 112 and the second active regions 114 are arranged so that the ends 118 of the first active regions 112 overlap the ends 116 of the second active regions 114 respectively neighboring the ends 118 in they direction. As described above, the ends 118 of the first active regions 112 are arranged a predetermined distance (DAcx) from the ends 116 of the second active regions 114 in the x direction.

In other words, in this embodiment, the plurality of first active regions 112 and the plurality of second active regions 114 (see FIG. 3, FIG. 6, and other drawings in this application) are alternately arranged so that both ends of the first active regions 112 and both ends of the second active regions 114 overlap with each other across the bit lines BL. As shown in FIG. 7B and other drawings in this application, the plurality of first active regions 112 and the plurality of second active regions 114 are isolated from each other by an insulating layer (isolation) 70. In other words, there are isolation between the active regions constituting the plurality of first active regions 112 and the plurality of second active regions 114.

Also, as shown in FIG. 7A and other drawings in this application, a ferroelectric capacitor C11 (or C21) is provided above the end 116 of a first active region 112 (or second active region 114) while a ferroelectric capacitor C12 (or C22) is provided above the other end 118 of the first active region 112 (or a second active region 114). Each ferroelectric capacitor has a laminated structure with a lower electrode 50, a ferroelectric layer 52 and an upper electric electrode 54. The lower electrode 50 of the ferroelectric capacitor C11 or C21 is connected via a plug 56 to the end 116 of the first active region 112 or the second active region 114, respectively, while the lower electrode 50 of the ferroelectric capacitor C12 or C22 is connected via a plug 58 to the end 118 of the first active region 112 or the second active region 114, respectively.

Furthermore, as shown in FIG. 7A and other drawings in this application, a bit line BL is connected via a plug 64, a substantially-rectangular pattern 66 and a plug 68 to a region 120 between the end 116 and the other end 118 of the first active region 112 or second active region 114. The region 120 can be considered source/drain regions common to two transistors TR driven by the word lines WL1 and W12 (or WL3 and WL4).

In this embodiment, as shown in FIG. 3 and other drawings in this application, a bit line BL, which is positioned between a first active region 112 and a second active region 114, has a protrusion portion that protrudes in the x direction in order to connect with the above region 120 (the plug 68) in each of the first active region 112 and the second active region 114. In other words, the protrusion portion is positioned above the region 120. As described above, the protrusion portion (a part of the bit line BL) is connected to the region 120 via the plug 64, the patterns 66 and 68, and the bit line BL is thereby connected to the first active region 112 and the second active region 114 (see FIG. 3 and FIG. 7).

In this embodiment, the bit line BL is provided with a protrusion portion for connection with the plug 68. However, the width of the bit line BL may be widened so as to cover the plug 68 above each of the first active region 112 and the second active region 114 on both sides of the bit line BL, so that the bit line BL is used in a strip shape. Incidentally, when the bit line BL is positioned below a plate line PL, it is preferable that a pattern with the aforementioned protrusion portion is used.

As shown in FIG. 3, FIG. 7 and other drawings in this application, the word line WL1 runs between the ends 116 and the plugs 64 on the first active regions 112 in the x direction, while the word line WL2 runs between the other ends 118 and the plugs 64 on the first active regions 112 in the x direction. The word lines WL1 and WL2 constitute gates of the n-type MOS transistors TR in the memory cells MC11 and MC12, respectively.

Also, as shown in FIG. 4 and other drawings in this application, the word line WL1 extends on the first active regions 112 in the x direction, but does not cross over the second active regions 114 neighboring the first active regions 112. In other words, as described above, when the first active regions 112 and the second active regions 114 overlap each other for the distance D1 in the y direction, the word line WL1 that extends in the x direction on the first active regions 112 will cross over the second active regions 114 depending on the amount of the overlap. Therefore, the word line WL1 is arranged bypassing (avoiding) the second active regions 114 so that it does not cross over the second active regions 114. In other words, the word line WL1 is arranged on the isolation between the second active regions 114. In this case, the word line WL1 will have bend portions (shifted portions, substantial L-shaped portions, and stair-like portions). The another word line WL2 is also arranged avoiding (bypassing) the active regions neighboring the active regions on which it runs.

Focussing on the two word lines arranged on one active region as shown in FIG. 4 and other drawings in this application, for example, the word lines WL1 and WL2 run between two second active regions 114 neighboring each of the first active regions 112 on which they run. In other words, the word lines WL1 and WL2 are positioned on the isolation (the insulating layer 70) in the regions other than the first active regions 112.

The distance (DW1) between the word lines WL1 and W1 on the first active regions is larger than the distance (DW2) between the word lines WL1 and WL2 where they run between the two second active regions 114 (on the isolation) (DW1>DW2). In other words, the word lines WL1 and W1 bend in the y direction or in the direction opposite the y direction alternately at fixed intervals, and extend in the substantially-x direction as a whole.

The word line WL3, as shown in FIG. 4 and other drawings in this application, extends on second active regions 114 in the x direction, and does not cross over these second active regions 112 and their neighboring first active regions 114. In other words, as described above, when the first active regions 112 and the second active regions 114 overlap each other for a distance D1 in they direction, the word line WL3, which runs on the second active regions 114 in the x direction, will cross over the first active regions 112. Therefore, the word line WL3 is arranged bypassing (avoiding) the first active regions 112 so that it does not cross over the first active regions 112. In other words, the word line WL3 is arranged on the isolation between the first active regions 112. In this case, the word line WL3 will have bend portions (shifted portions, substantially L-shaped portions, and stair-like portions). The another word line WL4 is also positioned avoiding (bypassing) the active regions neighboring the active regions on which it runs.

Also, focussing on the two word lines arranged on one active region, the word lines WL3 and WL4, for example, run between two first active regions 112 neighboring each of the second active regions 114 on which they run. In other words, the word lines WL3 and WL4 are positioned on the isolation (the insulating layer 70) in the regions other than the second active regions 114.

The distance (DW1) between the word lines WL3 and WL4 in the second active regions 114, as shown in FIG. 4 and other drawings in this application, is larger than the distance (DW2) between the word lines WL3 and WL4 where they run between the two first active regions 112 (on the isolation) (DW1>DW2). In other words, the word lines WL3 and WL4, as with the word lines WL1 and W12, bend in the y direction or in the direction opposite the y direction alternately at fixed intervals, and extend in the substantially-x direction as a whole.

The angle for the word lines WL1, WL2, WL3, and WL4 to bend can be determined arbitrarily. For example, it may be determined as 90° so that the word lines bend in a crank shape; however, 45° is preferable in view of the wiring patterning precision and design rules.

As shown in FIG. 3, FIG. 7A, FIG. 7B and other drawings in this application, the plate line PL1 is arranged in a substantial x direction so that it runs over the ferroelectric capacitors C11 provided above the first active regions 112 and the ferroelectric capacitors C22 provided above the second active regions 114. Furthermore, as shown in FIGS. 7A and 7B and other drawings in this application, the plate line PL1 is connected via the plugs 60 to the upper electrodes 54 of the ferroelectric capacitors C11 (or C21) immediately above the ferroelectric capacitors C11 (or C21).

Also as shown in FIG. 3, FIG. 7A, FIG. 7B and other drawings in this application, the plate line PL2 is arranged in a substantial x direction so that it runs over the ferroelectric capacitors C12 provided above the first active regions 112 and the ferroelectric capacitors C21 provided above the second active regions 114. Furthermore, as shown in FIG. 7A, FIG. 7B and other drawings in this application, the plate line PL2 is connected via the plugs 62 to the upper electrodes 54 of the ferroelectric capacitors C22 or C12) immediately above the ferroelectric capacitors C22 or C12).

As described above, according to this embodiment, the first and second active regions 112 and 114, to which ferroelectric capacitors connected to the bit lines BL are connected, are respectively arranged on both sides of the bit lines BL, and the first and second active regions 112 and 114 are arranged so that they overlap each other in the y direction, i.e., a direction the bit lines BL extend. Therefore, this embodiment reduces the size of the device by the amount of the overlap in the direction the bit lines BL extend.

Specifically, as described above, when the ferroelectric random access memory device is used in a display drive integrated circuit, it is possible for the distance between the bit lines BL to correspond to the distance between the wirings for an external display, and also to reduce the size of the display drive IC in the direction to which the bit lines BL extend. In other words, it is possible to provide a ferroelectric random access memory apparatus and display drive IC that is high in area efficiency.

According to this embodiment, the length of the bit line BL can be shortened, and thus, the wiring capacity can be reduced. Consequently, a large operation margin for a sense amplifier can be secured, the power consumption of the ferroelectric random access memory device can be reduced, and furthermore, noise superposition in the bit lines BL can be reduced.

In this embodiment, as shown in FIG. 4 and other drawings in this application, the first and second active regions 112 and 114 are arranged so that they overlap each other for the distance D1 in the y direction. However, there are no limits on the amount of the overlap; the aforementioned effect can be achieved even if they overlap only for a little amount. Certainly, as the amount of overlap increases, the degree of the above effect will also increase. For example, when the distance (spacing) DAcy between the active regions in the y direction is set to be minimum, the distance D1 will be maximum. When the word line width, the word line spacing and the distance between the word lines and the active regions are set to be minimum to the extent permitted by the design rules, the distance (spacing) DAcy will be minimum.

According to this embodiment, comparing with Embodiment 3 (e.g., FIG. 12) described later, the amount both ends of the first and second regions 112 and 114 overlap each other in the direction the bit line BL extends is larger, and therefore, it is possible to provide a ferroelectric random access memory device with its length in the direction the bit lines BL extend further shortened.

According to this embodiment, the ends of the first and second active regions 112 and 114 overlap each other in the y direction, and the ferroelectric capacitors are connected to those ends. Accordingly, these ferroelectric capacitors will be arranged in a substantially-straight line in the x direction (within an area having a certain width and extending in the x direction). Therefore, the first and second plate lines PL1 and PL2 connected to the ferroelectric capacitors can be arranged in a substantially-straight line, or in a manner in which they have few curve or corner portions, making it possible to reduce the loads on the first and second plate lines PL1 and PL2.

Furthermore, even when the first and second active regions 112 and 114 are arranged so that they overlap each other in the y direction, the arrangement of the word lines WL1 to WL4, that avoids (bypasses) the active regions neighboring the active regions on which those word lines extend, makes it possible for the memory cells MC11, MC12, MC21 and MC22 to be driven by the different word lines WL1 to WL4.

In other words, even if the first and second active regions 112 and 114 are arranged so that they overlap each other in the y direction, the arrangement of the word lines WL1 and WL4, that avoids (bypasses) the active regions neighboring the active regions on which those word lines extend, makes it possible for the ferroelectric capacitors connected to the first plate line PL1 to be driven by the different word lines WL1 and WL4. Similarly, the arrangement of the word lines WL2 and WL3, that avoids (bypasses) the active regions neighboring the active regions on which these word lines extend, makes it possible for the ferroelectric capacitors connected to the second plate line PL2 to be driven by the different word lines WL2 and WL3.

As a result, it will be possible to easily select a memory cell MC. Also, according to this embodiment, the number of plate lines PL can be reduced, and furthermore, the area of the plate control unit 130 that controls the voltages for the plate lines PL can also be reduced.

According to this embodiment, the arrangement of the word lines WL1 to WL4, that avoids (bypasses) the active regions neighboring the active regions on which those word lines extend, makes it possible to further reduce the distance (DAcy) between the plurality of first active regions 112 and the plurality of the second active regions 114 in the y direction, and thus, to provide a ferroelectric random access memory device with its length in the direction the bit lines extend further shortened.

Figure 8:
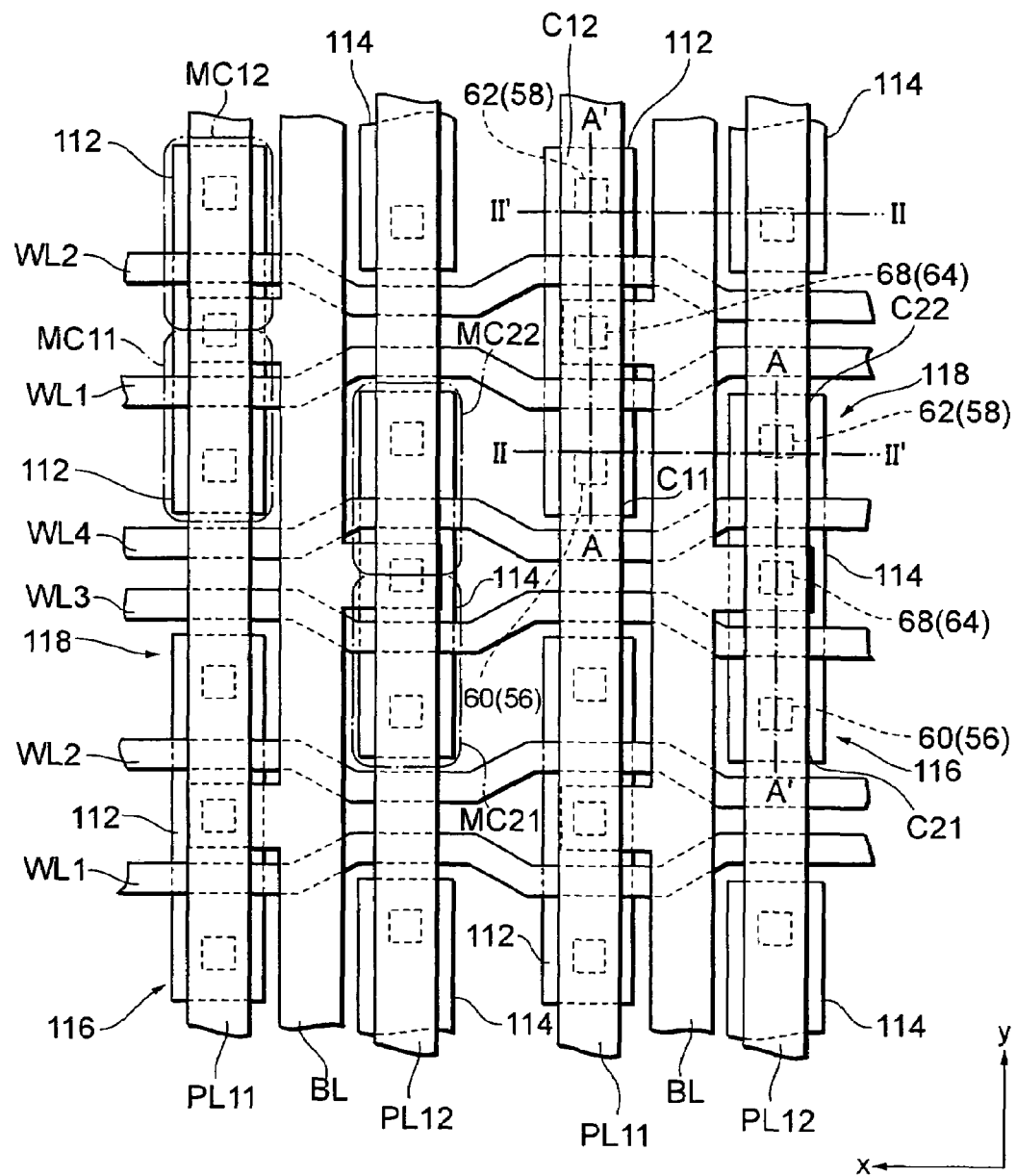
FIG. 8 is a plain view of a main part of the configuration of another memory cell array according to Embodiment 1.
Figure 9:
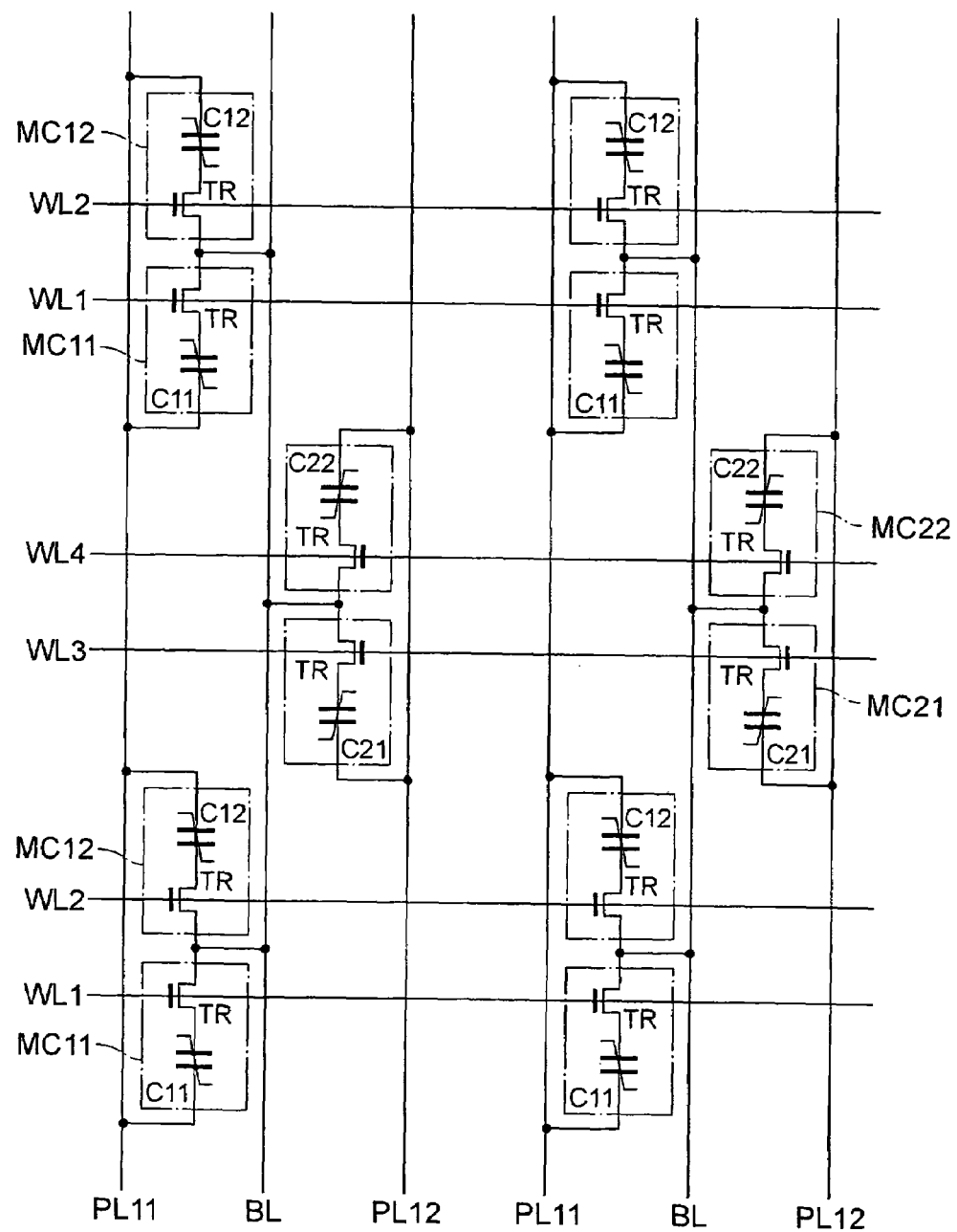
FIG. 9 is a circuit diagram illustrating the configuration of that other memory cell array according to Embodiment 1.

In this embodiment, the plate lines PL are arranged in the x direction as shown in FIG. 3. However, the plate line PL may be arranged in the y-direction as shown in FIG. 8. FIG. 8 is a plain view of a main part of another memory cell array according to this embodiment. FIG. 9 is a circuit diagram illustrating the configuration of that other memory cell array according to this embodiment. Incidentally, the parts corresponding to those in FIG. 2 and FIG. 3 are provided with the same reference numerals, and a detailed explanation of those parts will be omitted.

In this case, as shown in FIG. 8, the plate lines PL11 extend in the y direction so that they connect the first and second ferroelectric capacitors C11 and C12 that extend in the y direction (ferroelectric capacitors above the first active regions 112), while the plate lines PL12 extend in the y direction so that they connect the third and fourth ferroelectric capacitors C22 and C21 that arranged in the y direction (the ferroelectric capacitors above the second active regions 114).

In this case, as described above, because of the shortened length of the memory cell array 110 in the direction the bit lines extend (the y direction), the plate lines PL11 and PL12 will be shorter compared to when the plate lines extend in the x direction, making it possible to reduce the loads on the plate lines PL11 and PL12.

In other words, when the plate lines extend in the x direction, the ferroelectric capacitor capacities Cf for the memory cells connected to the plate lines will be connected in series. For example, when 32 memory cells are arranged in the x direction, a plate line PL is connected to the 32 memory cells, and the capacity for the plate line CPL will be approximately Cf×32 (CPL≈Cf×32). Meanwhile, when a plate line extends in the y direction, the ferroelectric capacitor capacities Cf for the memory cells connected to the plate line will be connected in parallel. Thus, the capacity for the plate line CPL will be approximately Cf×1, and therefore, the load capacity can be reduced to approximately 1/32.

In this embodiment, as described above, since there are margins between the bit lines BL, even if the bit lines and the plate lines are arranged in parallel, these wirings and the plugs below the wirings can easily be laid out.

Figure 10:
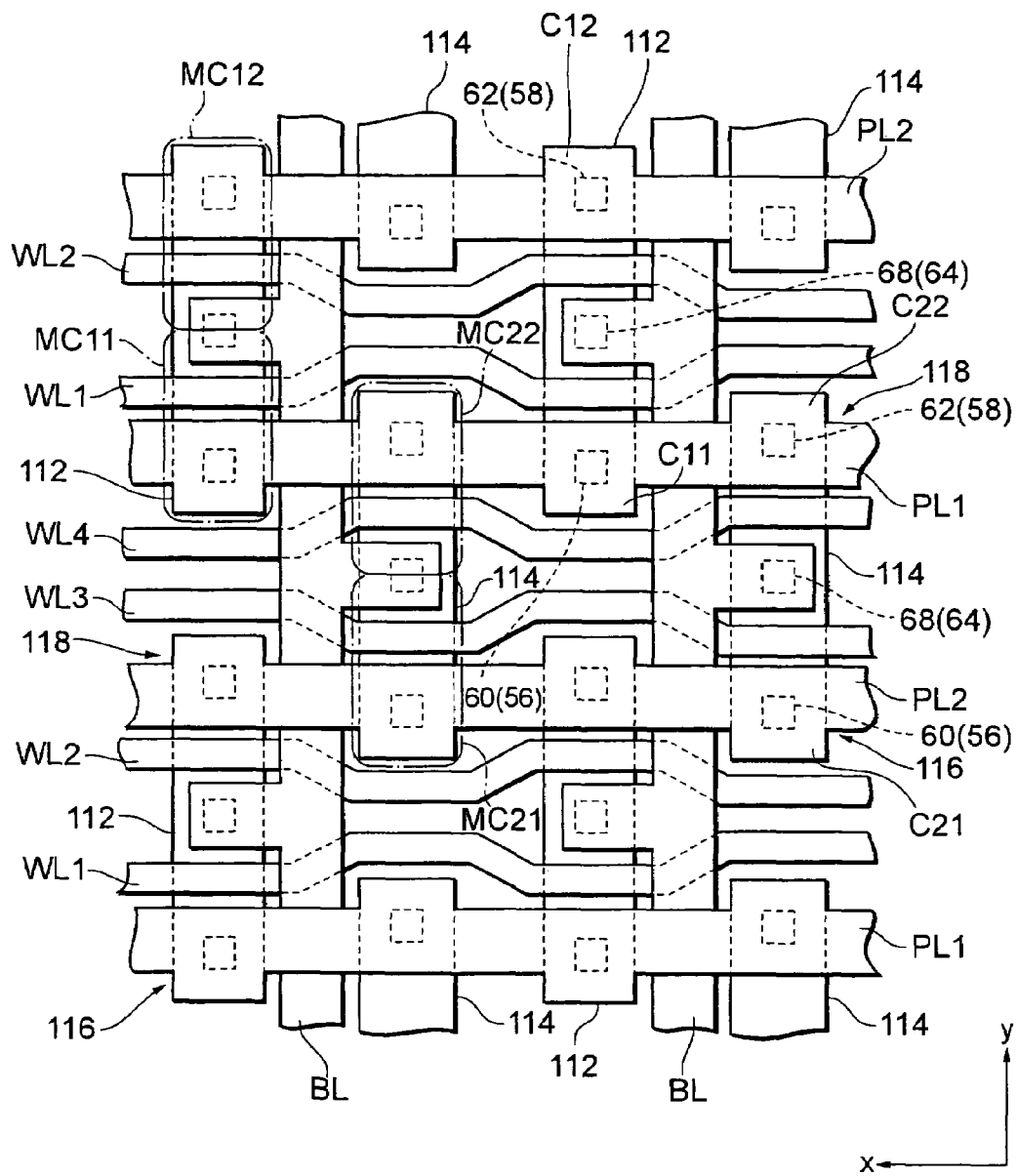
FIG. 10 is a plain view of a main part of the configuration of still another memory cell array according to Embodiment 1.

In this embodiment, the bit lines BL are positioned above the plate lines PL (see FIG. 3, FIG. 7A, FIG. 7B, and other drawings in this application). However, as shown in FIG. 10, the bit lines BL may be positioned below the plate lines PL. FIG. 10 is a plain view of a main part of still another memory cell array according to this embodiment. The parts corresponding to those in FIG. 3 and other drawings in this application are provided with the same reference numerals, and a detailed explanation of those parts will be omitted. In this case, as described above, it is preferable that the bit lines are patterned to have protrusion portions.

Also in this embodiment, the active regions (112 and 114) are formed in a substantial rectangular shape, but may be formed in another shape (e.g., an oval). In this embodiment, two cells (i.e., two transistors and two capacitors) are formed in one active region. However, the invention is not limited to that arrangement, and can be applied to a ferroelectric random access memory device or similar with one cell (i.e., one transistor and one capacitor) formed in one active region.

Embodiment 2

Figure 11:
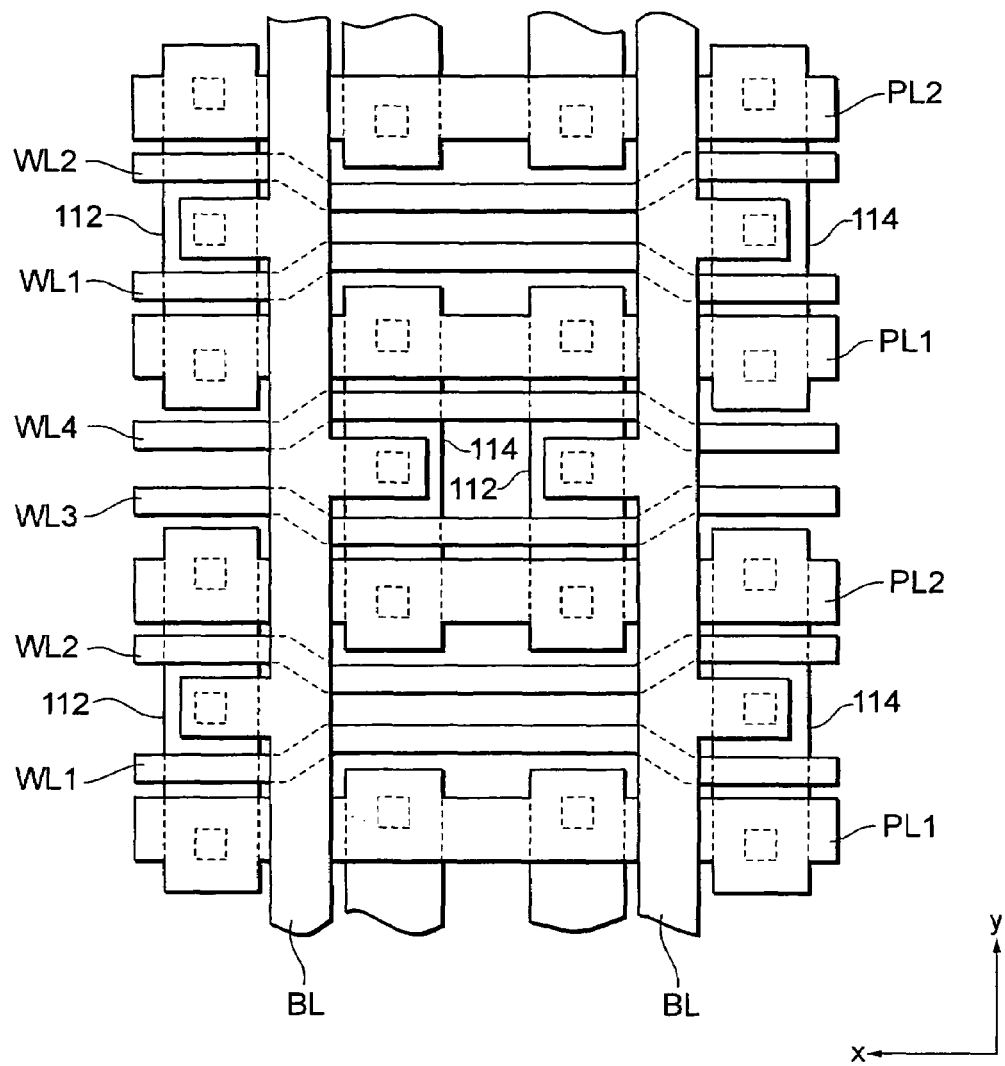
FIG. 11 is a plain view of a main part of the configuration of a memory cell array according to Embodiment 2.

FIG. 11 is a plain view of a main part of the configuration of a memory cell according to an embodiment of the invention. Incidentally, the parts corresponding to those in FIG. 3 and other drawings in this application are provided with the same reference numerals, and a detailed explanation of those parts will be omitted.

In this embodiment, first active regions 112 and second active regions 114, which are arranged on both sides of each bit line BL, are arranged in substantially the same manner as those in Embodiment 1 (FIG. 3). However, the first active regions 112, to which a predetermined bit line BL is connected, are arranged in substantially the same positions in the y direction as the second active regions 114, to which another bit line BL neighboring the predetermined bit line BL is connected. The second active regions 114, to which the predetermined bit line BL is connected, are arranged in substantially the same positions in the y direction as the first active regions 112 connected to that other bit line BL.

In other words, in Embodiment 1, the first active regions 112 and the second active regions 114 arranged on both sides of a bit line BL, as described above, partly overlap each other in the y direction. The first active regions 112 and the second active regions 114 arranged between bit lines BL partly overlap each other in the y direction.

Meanwhile, in this embodiment, the first active regions 112 and the second active regions 114 arranged on both sides of a bit line BL, as described above, partly overlap each other in the y direction; however, the first active regions 112 and the second active regions 114 arranged between bit lines BL are arranged in the substantially same positions in the y direction. In other words, they entirely overlap each other in the y direction.

In other words, in Embodiment 1, the layout in the x direction is the repetition of the cycle: a pattern A alignment of active regions—a bit line BL—a pattern B alignment of active regions—a pattern A alignment of active regions—a bit line BL—a pattern B alignment of active regions, while in Embodiment 2, the repeated cycle is: a pattern A alignment of active regions—a bit line BL—a pattern B alignment of active regions—a pattern B alignment of active regions—a bit line BL—a pattern A alignment of active regions.

A pattern A alignment of active regions means, for example, the leftmost line of active regions (112) in FIG. 11, while a pattern B alignment of active regions means, a line of active regions arranged with its starting point off from that of the pattern A alignment of active regions by a predetermined distance (D2 in FIG. 6).

As described above, this embodiment has the effect of reducing the number of points at which each word line WL bends, in addition to the effect explained in Embodiment 1.

In other words, in Embodiment 1 shown in FIG. 3, the word line WL1, for example, has three bend portions (shifted portion, substantially L-shaped portion, and stair-like portion), while in this embodiment shown in FIG. 11, the word line WL has two bend portions.

As described above, the number of bend portions can be reduced for each word line WL, making it possible to reduce process failures or fatigue failures.

In this embodiment, like in Embodiment 1, the width of a bit line BL may be widened so that it covers the plugs 68 above the first active regions 112 and the second active regions 114 to make the bit line BL in a strip shape.

Plate lines PL may be arranged in the y direction. In other words, the plate lines may be arranged in the y direction so that they are connected to ferroelectric capacitors above the first active regions 112 that extend in the y direction, and the plate lines may be arranged in the y direction so that they are connected to ferroelectric capacitors above the second active regions 114 that extend in the y direction.

In this embodiment, the bit lines BL are positioned above the plate lines PL. However, the bit lines BL may be positioned below the plate lines PL. In this case, as described in detail in Embodiment 1 with reference to FIG. 10, it is preferable that the bit lines BL are patterned to have protrusion portions.

In this embodiment, the active regions are shaped in a substantially rectangular shape. However, they may also be shaped in another shape (e.g., an oval, etc.). Furthermore, in this embodiment, two cells (two transistors and two capacitors) are formed above one active region. However, the invention is not limited to this arrangement, and may be applied to a ferroelectric random access memory device or similar in which one cell (one transistor and one capacitor) is formed above one active region.

Embodiment 3

Figure 12:
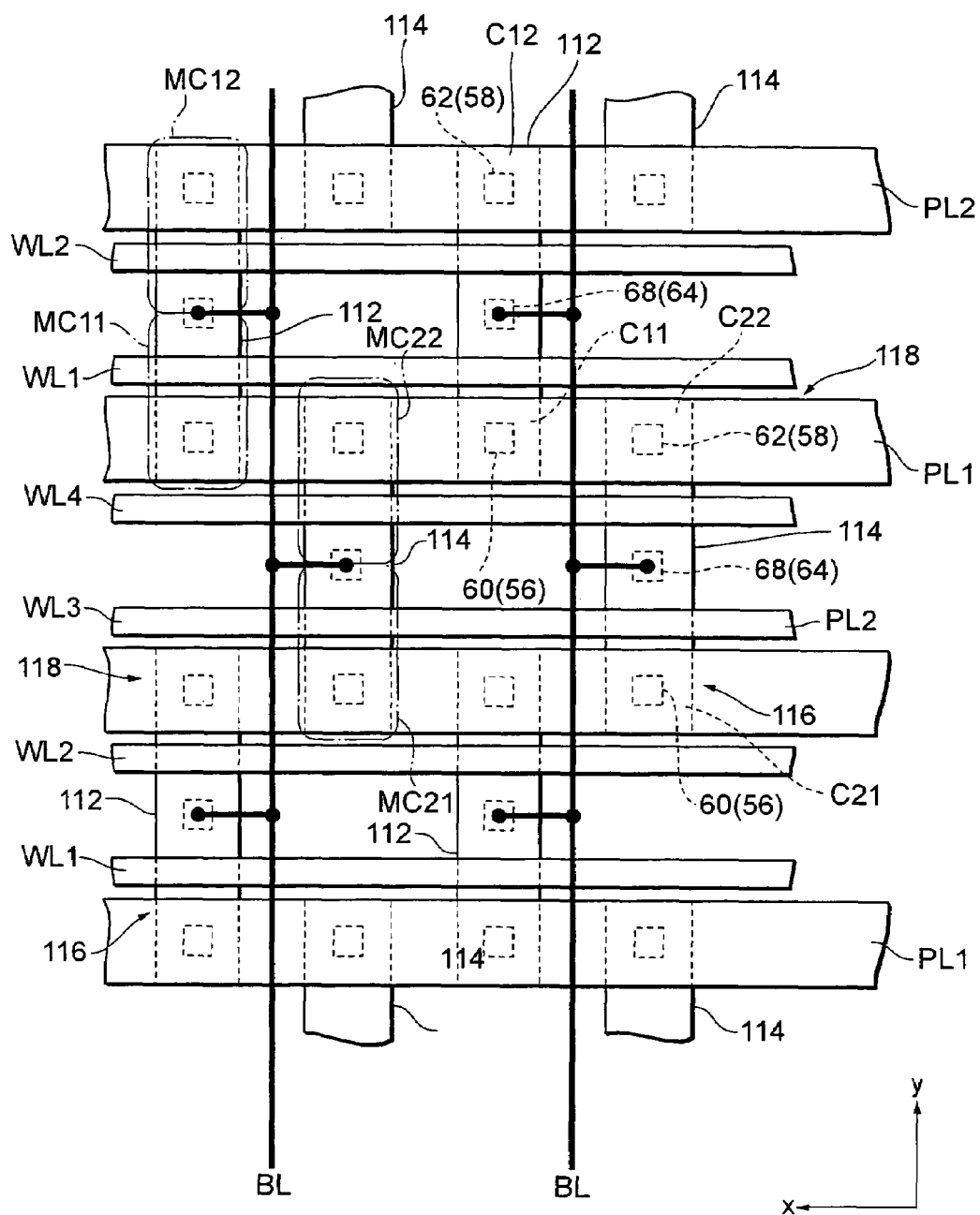
FIG. 12 is a plain view of a main part of the configuration of a memory cell array according to Embodiment 3.
Figure 13:
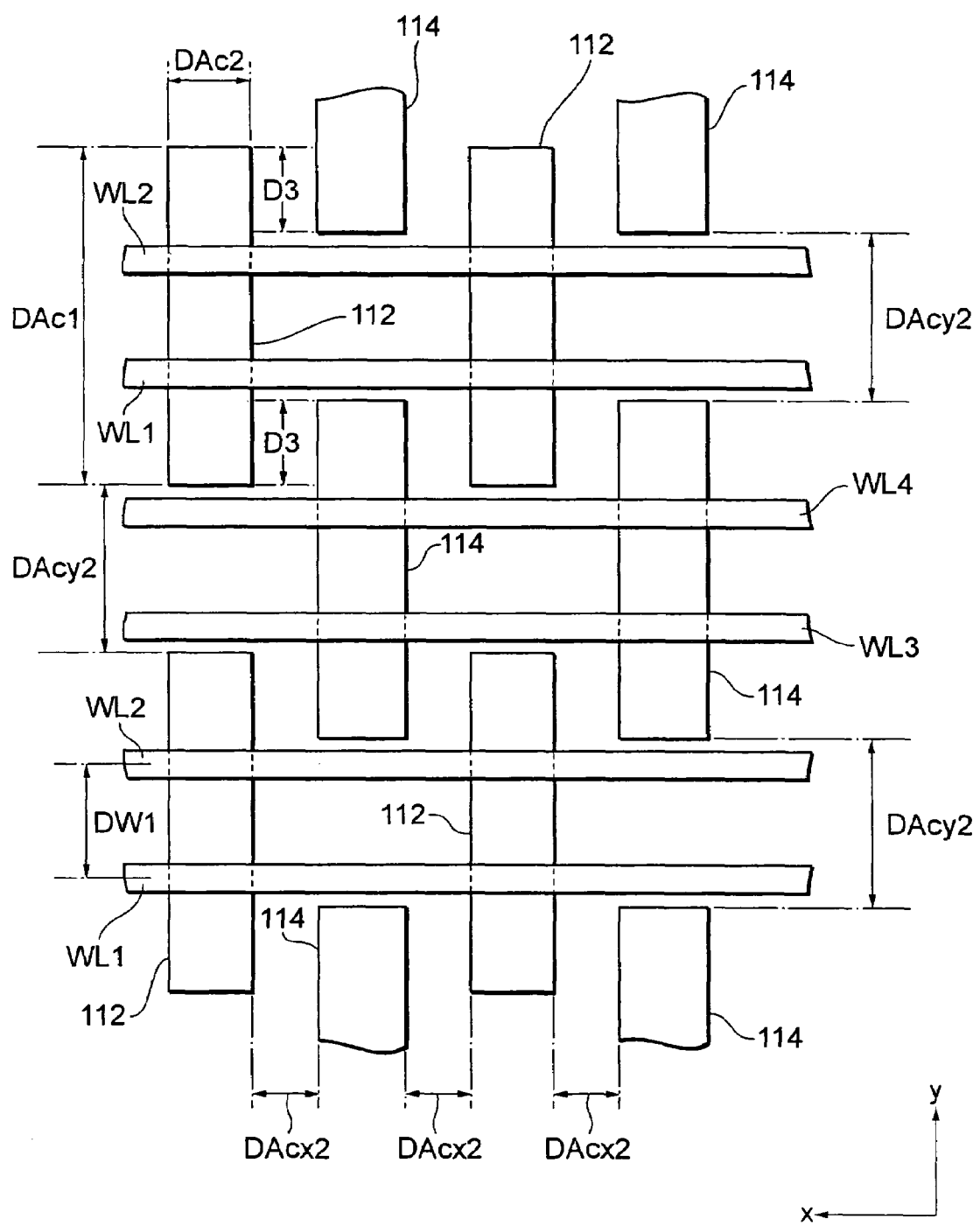
FIG. 13 is a plain view of a main part of the configuration of a memory cell array according to Embodiment 3.

FIG. 12 and FIG. 13 are plain views of a main part of the configuration of a memory cell array according to an embodiment of the invention. FIG. 13 is a diagram clearly indicating the relationship between the active regions 112 and 114, and the word lines WL1 to WL4 from among the plain pattern shown in FIG. 12. Incidentally, the parts corresponding to those in FIG. 3, FIG. 4 and other drawings in this application are provided with the same reference numerals, and a detailed explanation of those parts will be omitted.

In this embodiment, as shown in FIG. 13 and other drawings in this application, the first active regions 112 and the second active regions 114 are arranged so that they partly overlap each other in the y direction, like in Embodiment 1.

However, this embodiment differs from Embodiment 1 and others in that the amount of the overlap is small (D3<D1), and also in that the word lines WL1 to WL4 extend substantially-straight in the x direction and have no bend portions explained with reference to FIG. 3, FIG. 11 and other drawings in this application.

In other words, as shown in FIG. 13 and other drawings in this application, a plurality of first active regions 112 is arranged a predetermined distance (DAcy2>DAcy) from each other in the direction the bit lines BL extend (the y direction) (see FIG. 13), and a plurality of second active regions 114 is arranged a predetermined distance (DAcy2>DAcy) from each other in the y direction.

In this way, since larger spaces (isolation) are secured between the active regions in the y direction compared to Embodiments 1 and 2, even if the word lines are arranged substantially-straight in the x direction, the word lines will not cross over the active regions neighboring the active regions on which they run.

In other words, as shown in FIG. 13 and other drawings in this application, the word line WL1 (WL2) extends on first active regions 112 in the x direction, and are arranged on the isolation between the second active regions 114 without crossing over the second active regions 114 neighboring these first active regions 112.

Focussing on two word lines arranged on one active region, the word lines WL1 and WL2, for example, are arranged so that they run between two second active regions 114 neighboring the first active region 112 on which the word lines run. In other words, the word lines WL1 and WL2 are arranged on the isolation (insulating layer 70) in regions other than the first active region 112.

The amount of the distance (DW1) between the word lines WL1 and WL2 in the first active region 112 is the same as that of the distance between the word lines WL1 and WL2 that are between the two second active regions 114 (on the isolation).

Furthermore, the word lines WL3 (WL4), as shown in FIG. 13 and other drawings in this application, extend on second active regions 114 in the x direction, and are arranged on the isolation between the first active regions 112 without crossing over the first active regions 112 neighboring these second active regions 114.

Focussing on two word lines arranged on one active region, the word lines WL3 and WL4, for example, are arranged so that they run between two first active regions 112 neighboring the second active region 114 on which they run. In other words, the word lines WL3 and WL4 are arranged above the isolation (insulating layer 70) in regions other than second active regions 114.

The amount of the distance (DW1) between the word lines WL3 and WL4 in the second active regions 114 is the same as that of the distance between the word lines WL3 and WL4 that are between the two first active regions (on the isolation).

As described above, this embodiment does not require bend portions to be provided to word lines WL, and thus, the length of a memory cell array 110 in the x direction can be reduced. In other words, the distance (DAcx2) between the first active regions 112 and the second active regions 114 in the x direction can be reduced (DAcx2>DAcx; see FIG. 13). For example, the distance between the active regions in the y direction (isolation width) may be set to a particular distance or longer, obtained by adding the widths of the word lines to the distance between the word lines (see DW1 in FIG. 4) on active regions in the y direction, plus double the distance between a word line and an active region.

As described in Embodiments 1, 2 and others, the angle of the bending of the word lines WL1, WL2, WL3 and WL4 is set to a predetermined angle (e.g., 45 degree) in view of the wiring patterning precision and design rules.

Therefore, when the word lines bend with that angle on the isolation and run straight on the active regions, it is necessary to enlarge the isolation area in the x direction (distance between the first active regions 112 and the second active regions 114 in the x direction) compared to when the word lines run substantially fully straight.

In the above-described enlargement of the area, there would be no problem if the spacing was within that of wiring spacing for the aforementioned display (within the permitted range). However, the connection may be complicated due to the wiring spacing for the display and that for the memory cell array not conforming to each other if the spacing exceeds the permitted range accompanied by the reduction of wiring pitch for the display.

In this case, the employment of this embodiment, in which word lines are arranged in substantially straight lines, makes it possible to reduce the length of the memory cell array 110 in the x direction.

In this embodiment, as shown in FIG. 12, plate lines PL are arranged in the x direction. However, as described in detail in Embodiment 1 with reference to FIG. 8, the plate lines PL may be arranged in the y direction. In other words, the plate lines PL may extend in the y direction so that they connect to ferroelectric capacitors above the first active regions 112 that extend in the y direction, and they also may extend in the y direction so that they connect to ferroelectric capacitors above the second active regions 114 that extend in the y direction.

In this embodiment, the bit lines BL are positioned above the plate lines PL. However, the bit lines BL may be positioned below the plate lines PL. In this case, as described in detail in Embodiment 1 with reference to FIG. 10, it is preferable that the bit lines BL are patterned to have protrusion portions. In FIG. 12, for ease of viewing the drawing, the bit lines are shown with lines. However, they are, of course, in a strip shape with a certain width as shown in FIG. 3 and FIG. 10.

In this embodiment, the active regions are formed in a substantially rectangular shape. However, they may be formed in another shape (e.g., an oval, etc.). Also in this embodiment, two cells (two transistors and two capacitors) are formed in one active region. However, the invention is not limited to that arrangement, and may be applied to a ferroelectric memory device or similar in which one cell (one transistor and one capacitor) is formed in one active region.

The layout of the active regions (112 and 114) according to this embodiment is the repetition of the cycle: a pattern A alignment of active regions—a bit line BL—a pattern B alignment of active regions—a pattern A alignment of active regions—a bit line BL—a pattern B alignment of active regions, like Embodiment 1. However, as explained in Embodiment 2 with reference to FIG. 11, the repeated cycle may be: a pattern A alignment of active regions—a bit line BL—a pattern B alignment of active regions—a pattern B alignment of active regions—a bit line BL—a pattern A alignment of active regions.

Embodiments 1 to 3 are described on the premise that the bit lines are formed so that they conform to the pitch of a plurality of wirings for a display. However, the spacing of the plurality of wirings for the display and the spacing of the bit lines may not necessarily be the same. Only reduction of the difference between the display wiring spacing and the bit line spacing will ease the connection of these wirings, reducing connection failure between the wirings. Therefore, it is sufficient that at least the memory cell area has the above cell layout according to any of the above embodiments.

Next, electric optical devices and electronic apparatuses employing the above-described display will be explained below.

Figure 14A:
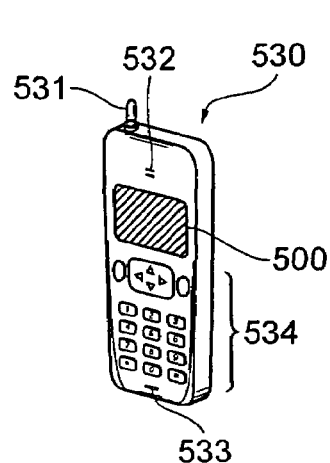
FIG. 14A to FIG. 14D are diagrams illustrating examples of an electronic apparatus using a display.
Figure 14B:
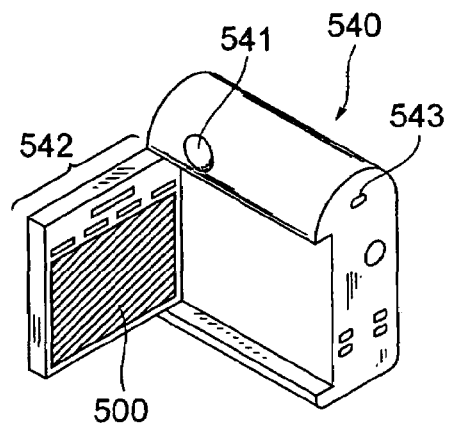
Figure 14C:
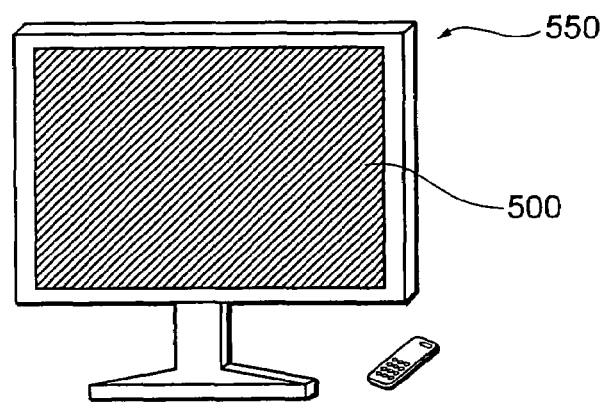
Figure 14D:
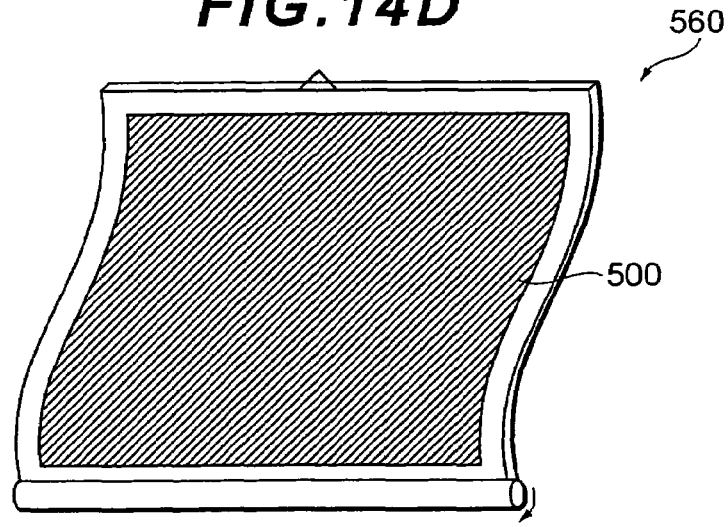

The invention is used, for example, as a drive circuit for an electrical optical apparatus (display apparatus or display). FIG. 14A to FIG. 14D show example electronic apparatuses using displays. FIG. 14A is an example of the invention applied in a portable telephone. FIG. 14B is an example of the invention applied in a video camera. FIG. 14C is an example of the invention applied in a television (TV). FIG. 14D is an example of the invention applied in a roll-up television.

As shown in FIG. 14A, a portable telephone 530 has an antenna portion 531, an audio output portion 532, an audio input portion 533, an input portion 534, and an electric optical device (display unit or display) 500. The invention can apply to this electric optical device.

As shown in FIG. 14B, a video camera 540 has an image receptor portion, 541, an operation portion 542, an audio input portion 543, and an electric optical device 500. The invention can apply to this electric optical device.

As shown in FIG. 14C, a television 550 has an electric optical device 500. The invention can apply to this electric optical device. The invention can also apply to a monitor apparatus used in a personal computer, etc.

As shown in FIG. 14D, a roll-up television 560 has an electric optical device 500. The invention can apply to this electric optical device.

In addition to the above, examples of electric apparatuses having an electric optical device include a facsimile apparatus with a display feature, a digital camera finder, a portable TV, an electric organizer, an electrical bulletin board, and an advertisement display.

Embodiments 1 to 3 relate to a memory cell array connected to a drive circuit for a display. However, the invention is not limited to such usage, and can be used as a ferroelectric random access device itself, or in various electronic apparatuses having ferroelectric memory.

The embodiments and applications explained above can arbitrarily be combined, or modified or altered according to the usage, and the invention is not limited to the above-described embodiments. The claims clearly indicate that such combinations, modifications, or alternations will also fall within the technical scope of the invention.

What is claimed is:

1. A ferroelectric random access memory device, comprising:
   at least one bit line extending in a first direction;
   a plurality of first active regions, arranged in the first direction a predetermined distance from each other on one side of the bit line, each being connected to the bit line and a first ferroelectric capacitor; and
   a plurality of second active regions, arranged in the first direction a predetermined distance from each other on the other side of the bit line, each being connected to the bit line and a second ferroelectric capacitor,
   the first active regions partly overlapping, in the first direction, the second active regions respectively neighboring the first active regions, and being arranged a predetermined distance from the respective neighboring second active regions in a second direction crossing the first direction.

2. The ferroelectric random access memory device according to claim 1,
   wherein the plurality of first active regions and the plurality of second active regions each have a first end and a second end;
   wherein the first ends of the first active regions overlap the second ends of the respective neighboring second active regions in the first direction; and
   wherein the first ends of the second active regions overlap the second ends of the respective neighboring first active regions in the first direction.

3. The ferroelectric random access memory device according to claim 2,
   wherein the first ferroelectric capacitors are connected to the first ends of the respective first active regions;
   wherein the second ferroelectric capacitors are connected to the second ends of the respective second active regions; and
   wherein the ferroelectric random access memory device further comprises a first plate line extending in the second direction and connected to a first ferroelectric capacitor from among the first ferroelectric capacitors and a second ferroelectric capacitor from among the second ferroelectric capacitors.

4. The ferroelectric random access memory device according to claim 3,
   wherein the bit line is connected to first areas between the first ends and the second ends of the first active regions, and also to second areas between the first ends and the second ends of the second active regions; and
   wherein the ferroelectric random access memory device further comprises:
      a first word line extending in the second direction and running between the first end and the first area of a first active region from among the first active regions;
      a second word line extending in the second direction and running between the second end and the first area of a first active region from among the first active regions.

5. The ferroelectric random access memory device according to claim 4,
   wherein the first word line and the second word line extend between a predetermined second active region, from among the second active regions, neighboring the first end of the first active region on which they extend, and another second active region, from among the second active regions, neighboring the second end of the first active region; and
   wherein the distance between the first word line and the second word line in the first active region is larger than the distance between the first word line and the second word line where they are between the second active region and the other second active region.

6. The ferroelectric random access memory device according to claim 4,
   wherein the first word line and the second word line extend between a predetermined second active region, from among the second active regions, neighboring the first end of the first active region on which they extend, and another second active region, from among the second active regions, neighboring the second end of the first active region; and
   wherein the distance between the first word line and the second word line in the first active region is substantially the same as the distance between the first word line and the second word line where they are between the second active region and the other second active region.

7. The ferroelectric random access memory device according to claim 2,
wherein the first ferroelectric capacitors are connected to the first ends of the respective first active regions;
wherein the second ferroelectric capacitors are connected to the second ends of the respective second active regions; and
wherein the ferroelectric random access memory device further comprises:
a first plate line extending in the second direction and connected to a first ferroelectric capacitor from among the first ferroelectric capacitors and a second ferroelectric capacitor from among the second ferroelectric capacitors;
a third ferroelectric capacitor connected to each of the second ends of the first active regions;
a fourth ferroelectric capacitor connected to each of the first ends of the second active regions; and
a second plate line extending in the second direction and connected to a third ferroelectric capacitor from among the third ferroelectric capacitors and a fourth ferroelectric capacitor from among the fourth ferroelectric capacitors.

8. The ferroelectric random access memory device according to claim 2,
wherein the first ferroelectric capacitors are connected to the first ends of the respective first active regions;
wherein the second ferroelectric capacitors are connected to the second ends of the respective second active regions; and
wherein the ferroelectric random access memory device furter comprises:
a first plate line extending in the first direction and connected to the first ferroelectric capacitors; and
a second plate line extending in the first direction and connected to the second ferroelectric capacitors.

9. The ferroelectric random access memory device according to claim 1, further comprising a first word line extending in the second direction on a region of a first active region, from among the first active regions, that overlaps its neighboring second active region, from among the second active regions,
wherein the first word line is arranged so that it extends, between a second active region from among the second active regions and another second active region neighboring the second active region, in the first direction, avoiding the second active region.

10. The ferroelectric random access memory device according to claim 1,
wherein a plurality of second active regions, arranged in the first direction a predetermined distance from each other on the other side of the bit line, each being connected to the bit line and a second ferroelectric capacitor, and a plurality of third active regions, arranged in the first direction a predetermined distance from each other on one side of another bit line neighboring the bit line, each being connected to the other bit line and a third ferroelectric capacitor, are arranged between the bit line and the other bit line; and
wherein the second active regions partly overlap, in the first direction, the third active regions respectively neighboring the second active regions, and are arranged a predetermined distance from the respective neighboring third active regions in a second direction crossing the first direction.

11. The ferroelectric random access memory device according to claim 1,
wherein a plurality of second active regions, arranged in the first direction a predetermined distance from each other on the other side of the bit line, each being connected to the bit line and a second ferroelectric capacitor, and a plurality of third active regions, arranged in the first direction a predetermined distance from each other on one side of another bit line neighboring the bit line, each being connected to the other bit line and a third ferroelectric capacitor, are arranged between the bit line and the other bit line; and
wherein the second active regions substantially fully overlap the third active regions respectively neighboring the second active regions in the first direction, and are arranged a predetermined distance from the respective neighboring third active regions in a second direction crossing the first direction.

12. A display drive integrated circuit comprising the ferroelectric random access memory device according to claim 1.

13. An electric apparatus comprising the ferroelectric random access memory device according to claim 1.

* * * * *